Nov. 11, 1969 R. C. ISON 3,478,271
NOISE CONTROL CIRCUIT
Filed Jan. 19, 1967
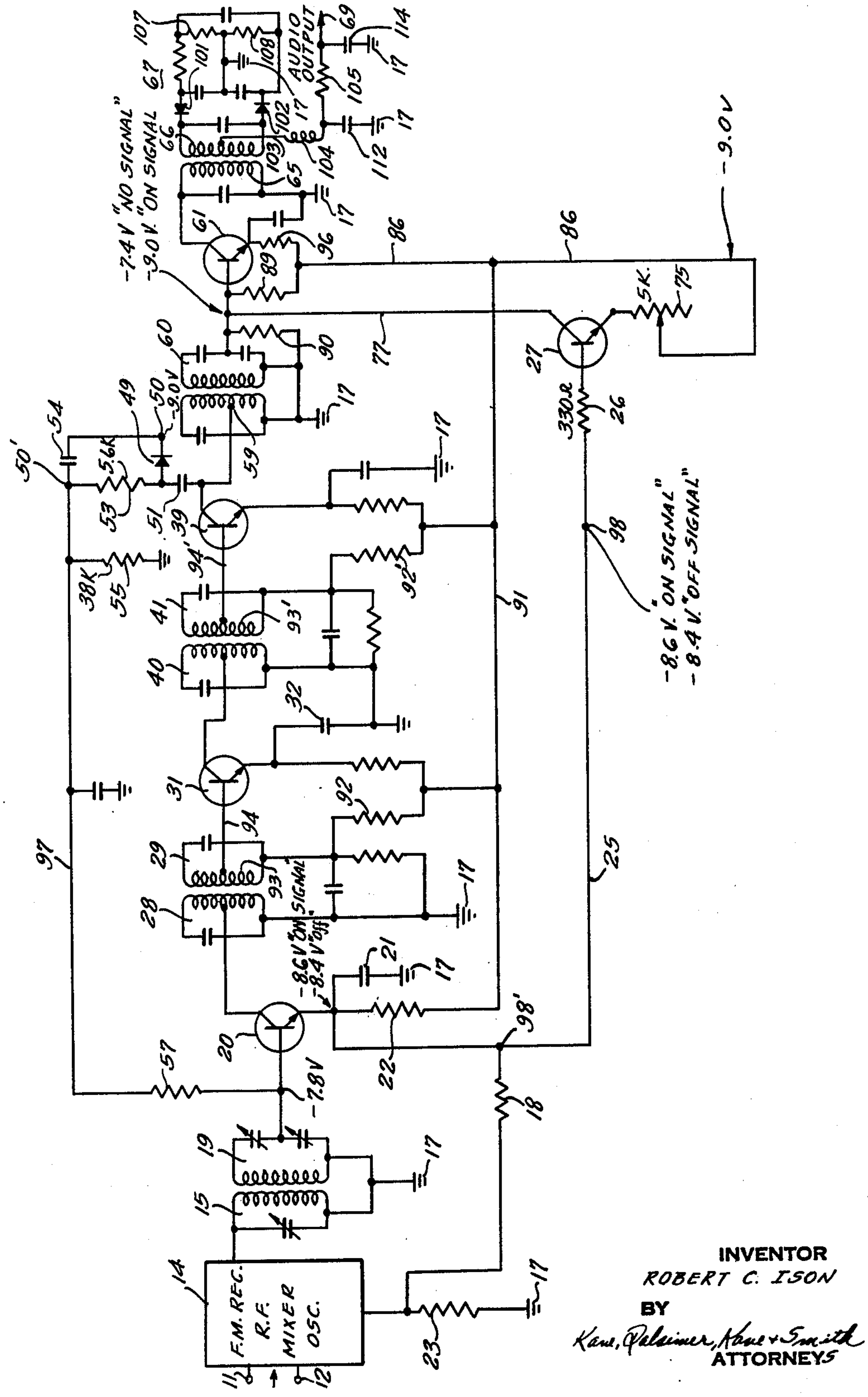
INVENTOR
ROBERT C. ISON
BY
Kane, Dalsimer, Kane + Smith
ATTORNEYS United States Patent Office 3,478,271
Patented Nov. 11, 1969

3,478,271

NOISE CONTROL CIRCUIT

Robert C. Ison, St. Joseph, Mich., assignor to V-M Corporation, Benton Harbor, Mich., a corporation of Michigan Filed Jan. 19, 1967, Ser. No. 610,433
Int. Cl. H04b *1/10*
U.S. Cl. 325—478 6 Claims

ABSTRACT OF THE DISCLOSURE

The invention relates to circuitry to obtain substantial noise immunity in FM receivers during periods when reception is changed between different incoming signal sources. An automatic gain control voltage is derived in an intermediate frequency amplifier stage subsequent to the first. The derived signal is used to control receiver gain and also to establish the operational periods of a triggering device that is connected to shunt an amplifying stage subsequent to that which the automatic gain control voltage is derived. Conductivity through the triggering device is limited to time periods when there is an absence of incoming carrier signals. At such times the conductive trigger short-circuits the amplifier and cuts off the receiver. During other time periods the triggering device is inoperative and normal receiver operation with automatic gain control is provided.

THE INVENTION

This invention relates to circuitry for controlling the output from an intermediate frequency amplifier cascade of an FM receiver with the establishment of an improved noise immunity during time periods when the receiver is being tuned between different stations and signal carrier is absent.

THE DESCRIBED INVENTION

This invention provides a noise squelching circuit particularly adapted to frequency modulation receivers. Intermittent frequencies are normally developed at the head of the FM receiver. The resultant signals are passed through a multi-stage intermediate frequency amplifier prior to being converted into audio signals to be supplied to a load circuit of any desired form. The intermediate frequency amplifiers normally comprise a cascade of solid state amplifier stages, usually connected as common emitters. An automatic gain control signal is developed in one of the stages of the intermediate frequency amplifier subsequent to the first stage. The gain control signals vary substantially during the presence or absence of carrier voltage in the intermediate frequency signals obtained. The developed automatic gain control signals are used to develop a voltage suitable for use as a control voltage supplied as an input signal to a triggering element connected to shunt the input of a control stage of the cascade of solid state amplifiers following the automatic gain control device. The short-circuiting of the amplifier stage occurs only during time periods when input signals are missing and it results in substantial noise immunity in the final output circuitry.

The circuit comprises essentially solid state components with which the triggering device cooperates. The incoming signal voltage is controlled in the degree of amplification in whatever number of stages of the receiver circuit precedes that in which the automatic volume control voltages are developed.

THE OBJECTS OF THE INVENTION

The invention has as its main objective that of providing a relatively simple and low cost noise immunity circuit particularly adapted to high fidelity FM receiver operation wherein noise, which would normally be present in the output circuit, is attenuated in the head-end of the receiver. Other objects of the invention are to provide an improved squelch circuit wherein transistors which, at times, limit the sensitivity to noise, can be used with the precise amount of noise immunity normally desired. Still other and further objects and advantages of the invention will become apparent from a reading of the following description considered in conjunction with the single figure of the accompanying drawing which schematically represents the preferred circuit embodiment.

THE CIRCUITRY INVOLVED

If reference is made now to the single figure of the drawing, illustrating one preferred circuit form of the invention, the incoming signal voltage derived from an antenna (not shown) is supplied through an in-feed cable or the like (also not shown) to the input receiver terminals 11 and 12. These supplied signals are then connected to energize a generally conventional FM type receiver unit which incorporates all of the R.F., the mixer and the oscillator units (none of which are shown other than by the schematic block diagram).

The output from the FM receiver is supplied into a suitable tuned circuit 15 having one terminal connected to ground 17, or some other equally suitable and stable connecting point. This tuned circuit, like the coupled circuit 19, is tuned to the desired intermediate frequency which is to be amplified, the tuning being accomplished in any desired and recognized fashion. Output from the input tuned circuit 19 comprising the indicated inductive and capacitor elements is then supplied to the base element of an amplifying transistor 20 of any desired type and form. The transistor 20 is connected as a common emitter type, with the emitter being at AC ground through capacitor 21 and providing an output voltage across its output resistor 22 which is fed in one direction across the combined resistors 18 and 23 to provide, via conductor 25 an input resistor 26, a suitable voltage to the base of a trigger transistor 27, which will later be described in further detail.

The amplifying transistor 20 of the IF stage connects in cascade fashion through the indicated tuned circuits 28 and 29, to a suitable input of a second transistor stage 31. Transistor stage 31 also is connected as a common emitter with the said emitter likewise provided at AC ground through capacitor 32 and having its emitter connected to a substantially fixed source of biasing voltage like that supplied to the first amplifier stage 31. Again, the amplifier stage 31 is connected in a similar fashion to the cascaded stage 39 through the tuned circuits 40 and 41.

The stage 39 provides the automatic gain control voltage through the diode 49. This voltage is developed in accordance with the current flow through the series combination of capacitor 51 and resistor 53 thereby to provide a control of the voltage through the diode 49 and available through capacitor 54 across resistor 55 and then through resistor 57 to control the potential available on the base of the transistor 20. The developed voltage is due to the generated automatic gain control signal.

This gain control signal builds up in such a way as to control the final output current which flows through the transistor 20. Current flow through the transistor 20, as supplied across the series combination of resistors 18 and 23, then determines the voltage on the conductor 25 which will control the current flow through transistor 27.

The automatic gain control unit 39 has its output fed across suitable tuned circuits 59 and 60 to the base of the transistor 61 which constitutes the final I.F. output from the combination.

The output from the final I.F. amplifier stage is supplied through the output circuit 65 which is tuned by the combination of the inductive transformer primary winding and shunting capacitor. This circuit is coupled into the similarly tuned input 66 in the usual fashion. The tuned input 66 constitutes the secondary of the transformer and supplies a suitable discriminator circuit conventionally represented at 67. The discrimiator circuit, which is usually in the form of a ratio detector, is provided to supply the final audio output at an output terminal represented at 69. The ratio detector circuit normally comprises a pair of diode elements 101 and 102 poled as indicated and connected to the opposite ends of the tuned secondary 66. A conductor 103 connects from substantially at the midpoint of the secondary winding 66 to a coil 104 which then leads through a resistor 105 to the output terminal 69. The coil 104 is usually an untuned coil and the voltage in it can be considered as being 180° out of phase with the voltage across the terminal winding 65. The voltage as supplied to the diodes 101, 102, is also in quadrature relative to the voltage in the coil 104. The circuit generally functions in such a way that resistors 107 and 108 connect with the diode and their junction connects by way of a conductor 109 to the ground terminal 17 so that a return path for the current through the diodes is provided through one or the other resistors, the ground connection and thence through the capacitor 112 (or in some instances through capacitor 114 and resistor 105 with capacitor 112 omitted) which is in series to ground 17 with the coil 104. The combination of resistor 105 and the grounded capacitor 114 provides the normal de-emphasis network.

In the foregoing fashion, it will be appreciated that the net diode current flow through the coil 104 and the capacitor 112 is essentially zero and no voltage drop will occur across the capacitor 112 when the instantaneous intermediate frequency is at the resonant frequency of the transformer. If, now, however, the instantaneous frequency of the incoming signal happens to be different from the resonant frequency of the tuned circuit 65, then it is apparent that the currents which flow through the two diode elements 101, 102 will differ and the voltage then will depend upon the difference in the diode currents. This is to say that the current flow can be considered as dependent upon the departure of the instantaneous frequency of the incoming signal from the resonant frequency of the tuned circuit 65. Thus, by well known analysis, for these conditions, a voltage drop will take place across the capacitor 112 and this will be in accordance with the audio modulating signal. For these conditions, then, the varying difference between the current flow through the diodes 101 and 102 can be used as a source of the audio output signal which is finally derived at the output terminal 69.

Other forms of discriminator circuits may be used at many times so that the form above suggested and diagrammed is purely illustrative.

The voltage which is developed by the output of the automatic gain control unit 39 supplies the control of the current flow through the trigger unit 27. The circuitry is normally so set up that when no signal voltage is applied to the antenna or other component connected at input terminals 11 and 12, the voltage at the emitter of the transistor unit 20 is normally about −8.2 volts. This voltage increases as the signal on the input terminals 11 and 12 increases until the voltage reaches approximately −9.0 volts which will be found as the voltage available at the cathode element of the diode 49 at connecting point 50. In the connection of the various components, adjustment can readily be made in the value of the variable resistor 75 in the emitter circuit of the transistor 27. As already suggested, this transistor is so adjusted that it is carried into a conductive state when there is no signal present at the input terminals 11 and 12. This is done by a variation of the resistor 75. Then transistor 27 will conduct at approximate times and by virtue of the connection through conductor 77 between the collector of transistor 27 and the base of transistor 61, and with a condition of no signal present at the antenna terminals 11 and 12, the transistor 27 will be carried to a conductive state. Such conductivity will then place the base of the transistor 61 at a suitable voltage bias to cut it off. The resistors 89 and 90 form a voltage divider and normally set a bias on transistor 61 which will yield about a maximum gain therethrough. This will be a voltage of the order of 7.2 volts which is normally calculated for a circuit of the type described. Under the circumstances the transistor 61 is carried to a cut-off state.

If now a signal voltage is present at the antenna terminals 11 and 12, the voltage at the emitter of transistor 20 changes to about −8.4 volts which places the base of transistor 27 at about this voltage and the transistor is carried to a state where it ceases to conduct. Then transistor unit 61 conducts as before. This circuitry provides a set-up such that when a signal is present at the antenna input terminals 11 and 12, the voltage at the emitter of transistor 20 always changes in a direction to change the transistor 27 to a non-conducting component which, by virtue of the connection established through the used portion of the variable resistor 75, and then through conductors 86 and 77 and resistor 89, causes the transistor 61 to cut off because of the indicated signal polarities. Under the circumstances, transistor 61 will have the biasing voltage applied to its base decreased to an extent sufficient to turn on the transistor and provide for signal transmission therethrough in the normal fashion. The operation is such that when transistor 61 is conducting, transistor 27 is in a non-conducting state and vice versa.

The circuitry described functions with considerable rapidity due to the rapid rate at which the transistor components may be activated or rendered conducting and the rapid rate at which they are rendered non-conducting. This factor makes it possible to arrive at a situation where the carrier level only is the controlling factor whether or not noise squelching is satisfactorily achieved. Further than this, the control of the noise and the squelching effect is achieved in the operating portion of the circuit where all signals are in the intermediate frequency range which is of significant advantage.

From the foregoing, it will be apparent that the voltage applied by way of conductors 86 to the base of transistor 61 is also effective by way of conductor 91 upon transistors 31 and 39, respectively. A direct current path is provided through resistors 92 or 92′ and a portion of the winding 93 or 93′, as the case may be, and the connection through conductors 94 or 94′ to the bases of the transistors 31 and 39, respectively. It can be seen that transistor 61 is cut off by virtue of the shunting path provided by the trigger transistor 27 having its collector connected through conductor 77 directly to its base and its emitter connected through the variable resistor 75 by way of conductors 86 and resistor 96 leading to its emitter.

In the light of the foregoing description, it will be observed that modulation of any kind cannot appear at the output of transistor 61 during a time period when there is an absence of input carrier on the input base of the transistor 20.

In the foregoing description, certain capacitors and resistors have not been specifically referred to since reasonably wide latitude may be permitted for the necessary control and achievement of the desired end results. Certain voltages at which applicant has found operation appears to function most satisfactorily are specified on the drawings with lead lines to indicate the point at which voltage, measurements, relative to ground, are made. Normally, certain points provide different voltages for conditions when carrier is received at the input terminals 11 and 12 as compared to periods of interrupted carrier. For these reasons, in some instances, two different voltage values are shown. Illustrative of these voltage differences, it may be noted that the output at the emitter of transistor 20, illustratively, is for an average operation about −8.4 v. for conditions when no carrier is received as compared to a voltage of −8.6 v. for conditions when signals are received. Following this analogy, and assuming no voltage drop in the base resistor 26, the base of transistor 27 will be supplied with similar voltage. For this condition, the voltage at the emitter of the transistor 27 may be about −9.0 v. for conditions of being the "on" signal as against about −8.9 v. for being the "off" signal. The voltage which is effective at the base of transistor 61 due to the transistor 27 in its conductive state, then also is approximately −8.9 v. for conditions of being off signal, but, since transistor 27 is cut off for periods of being on signal, the voltage available for control at the transistor 61 changes to about −7.2 v. for conditions of being on signal. The voltage which is fed back through the conductor 97 from the automatic gain control varies from about −9.0 v. at point 50 to about −7.8 v. at point 50'. For some conditions the automatic volume control voltage available at the connecting point 50' can be supplied directly to the trigger transistor 27 by way of a connection (not shown) from connecting point 50' to connecting point 98 in which event the circuit connection shown presently at point 98' between resistor 21 and resistor 26 connected to the base of transistor 20 would no longer exist. Further than this, while resistor 26 is normally a relatively low resistor (something in the order of about 330 ohms) it would then change to a rather high resistor (something of the order of about 100,000 ohms). In some instances, a connection of this type is desirable for normal use. One other point which might be mentioned is that the N-P-N type silicon transistor 27 is preferably of the type commonly known as the TI–417, although it is to be understood that any general purpose silicon transistor having a breakdown at least as high as 9 volts may be substituted.

If a different characteristic of transistor is used, it will be appreciated that certain voltages and even polarities may have to be changed, which, of course, may be done in well recognized fashion.

Many modifications of the circuit described and illustrated, of course, can be made without departing from the spirit and scope of what is herein set forth.

Having now described the invention, what is claimed is:

1. A circuit for reducing the output noise from frequency modulation receivers which include detector means to develop intermediate frequencies from received carrier signals to which modulation may be added comprising an amplifier of at least two stages, a load circuit connected to the amplifier and including means to derive audio signals from the amplified signals, trigger means having its output circuit connected in shunt to one of the amplifying stages, means to develop an automatic gain control voltage in a stage of the amplifier preceding the shunted stage, the said automatic gain control voltage being proportional to the presence and absence of carrier input frequency, means for initiating a current flow through the trigger circuit during the absence of carrier signal in the developed intermediate frequency signals, and means for feeding the developed gain control signals to control the energization of the trigger means and to bias said means to an inoperative state during the presence of gain control voltages and to remove the biasing voltage at time periods when there is an absence of carrier frequency on the developed intermediate frequency input, whereby the shunted amplifier stage is short-circuited to provide an absence of output signals at triggered level signals corresponding to conductive periods of the trigger and whereby the short-circuiting effect is removed during the presence of carrier signal input modulation.

2. The circuit claimed in claim 1 comprising, in addition, means to control the amplification level of the amplifier stages at each stage preceding that at which the automatic gain control voltages are developed.

3. The circuit claimed in claim 1 wherein each of the said amplifying stages is a solid state device and wherein the trigger means is also a solid state device connected with its output shunting the input to an amplifier stage following that from which the automatic gain control signal is developed, whereby conductivity within the trigger circuit short circuits the input to the said amplifier stage.

4. The circuit claimed in claim 1 wherein the trigger means comprises a transistor having its input circuit connected to receive control input signal voltages from the output of the gain-controlled amplifier stage and wherein the output circuit of the trigger means shunts an amplifier stage beyond that from which the automatic gain control voltage is derived.

5. The circuit claimed in claim 1 comprising, in addition, resistor means connected between the automatic gain control means and the gain controlled input to the trigger means for supplying voltage thereto at a level for applying bias voltages to interrupt conductivity through the trigger means during the presence of carrier voltages in the received signals and to remove the biasing voltages from the trigger means thereby to initiate conductivity through the trigger means to short-circuit at least one amplifier stage thereby to remove input to the load circuit at all times when carrier frequency input to the amplifier is not present.

6. A circuit for squelching noise in frequency modulator rceivers wherein intermediate frequencies are developed for amplification prior to being supplied to a load circuit as audio signals which comprises the combination of a cascaded series of transistor amplifiers, means for feeding input signals through the cascade for amplification, means in a stage of amplification subsequent to the first for developing an automatic gain control signal voltage indicative of the presence or absence of carrier voltage in the intermediate frequency signal, means for feeding the derived automatic gain control signal voltage back to the input of an amplifying stage preceding that at which the gain control voltage is developed, a trigger transistor element, means to supply a voltage to the input of the trigger transistor which is proportional to the output of the gain-controlled transistor of the cascade, means to connect the trigger transistor with its output circuit shunting the input circuit of a transistor in the cascade following that from which the automatic gain control signal is developed, and means to supply a control voltage to the input of the trigger transistor from the gain-controlled stage of the cascade for nullifying the bias voltage tending to establish conductivity for that period of time during which carrier input is present in the amplified voltages and for restoring the transistor to a conductive state thereby to short circuit the cascaded amplifier during periods when the carrier frequency input is absent.

References Cited

UNITED STATES PATENTS 3,374,437 3/1968 Heald ............ 325—478

KATHLEEN H. CLAFFY, Primary Examiner

BARRY PAUL SMITH, Assistant Examiner

U.S. Cl. X.R.

325—348, 403